US 8,143,654 B1

(12) United States Patent  (10) Patent No.: US 8,143,654 B1
Saunier  (45) Date of Patent: Mar. 27, 2012

(54) MONOLITHIC MICROWAVE INTEGRATED CIRCUIT WITH DIAMOND LAYER

(75) Inventor: Paul Saunier, Addison, TX (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 944 days.

(21) Appl. No.: 12/015,415

(22) Filed: Jan. 16, 2008

(51) Int. Cl.
*H01L 29/66* (2006.01)

(52) U.S. Cl. ........ 257/275; 257/728; 257/E23.111

(58) Field of Classification Search .......... 257/275, 257/276, 277, 728, E21.604, E23.111
See application file for complete search history.

(56) References Cited

U.S. PATENT DOCUMENTS

| | | | | |
|---|---|---|---|---|
| 4,376,287 A * | 3/1983 | Sechi | ............ | 257/668 |
| 4,929,986 A * | 5/1990 | Yoder | ............ | 257/275 |
| 5,084,750 A * | 1/1992 | Adlerstein | ............ | 257/574 |
| 5,159,413 A * | 10/1992 | Calviello et al. | ............ | 505/191 |
| 5,164,359 A * | 11/1992 | Calviello et al. | ............ | 505/330 |
| 5,202,752 A * | 4/1993 | Honjo | ............ | 257/678 |
| 5,356,831 A * | 10/1994 | Calviello et al. | ............ | 117/105 |
| 5,382,758 A * | 1/1995 | Iacovangelo et al. | ............ | 174/262 |
| 5,521,406 A * | 5/1996 | Tserng et al. | ............ | 257/276 |
| 5,612,257 A * | 3/1997 | Tserng et al. | ............ | 438/108 |
| 5,757,032 A * | 5/1998 | Nishibayashi et al. | ............ | 257/77 |
| 6,028,348 A * | 2/2000 | Hill | ............ | 257/666 |
| 6,137,125 A * | 10/2000 | Costas et al. | ............ | 257/275 |
| 6,521,923 B1 * | 2/2003 | D'Anna et al. | ............ | 257/288 |
| 6,614,095 B1 * | 9/2003 | Adamschik et al. | ............ | 257/621 |
| 6,913,999 B2 * | 7/2005 | Searls et al. | ............ | 438/667 |
| 7,027,789 B2 * | 4/2006 | Ammar | ............ | 455/232.1 |
| 7,148,079 B1 * | 12/2006 | Raman et al. | ............ | 438/105 |
| 7,230,314 B2 * | 6/2007 | Udrea et al. | ............ | 257/502 |
| 7,233,208 B2 * | 6/2007 | Greene | ............ | 330/296 |
| 7,257,381 B2 * | 8/2007 | Ammar | ............ | 455/73 |
| 7,355,215 B2 * | 4/2008 | Parikh et al. | ............ | 257/194 |
| 7,361,946 B2 * | 4/2008 | Johnson et al. | ............ | 257/253 |
| 7,674,719 B2 * | 3/2010 | Li et al. | ............ | 438/708 |
| 2004/0009649 A1 * | 1/2004 | Kub et al. | ............ | 438/459 |
| 2004/0056272 A1 * | 3/2004 | Searls et al. | ............ | 257/177 |
| 2005/0067716 A1 * | 3/2005 | Mishra et al. | ............ | 257/778 |
| 2006/0135103 A1 * | 6/2006 | Ammar | ............ | 455/232.1 |
| 2006/0199353 A1 * | 9/2006 | Kub et al. | ............ | 438/455 |
| 2006/0284167 A1 * | 12/2006 | Augustine et al. | ............ | 257/40 |
| 2006/0284247 A1 * | 12/2006 | Augustine et al. | ............ | 257/338 |
| 2007/0026676 A1 * | 2/2007 | Li et al. | ............ | 438/689 |
| 2007/0194384 A1 * | 8/2007 | Robinson | ............ | 257/367 |
| 2009/0108437 A1 * | 4/2009 | Raymond | ............ | 257/713 |
| 2010/0038776 A1 * | 2/2010 | Bessemoulin | ............ | 257/728 |
| 2010/0059791 A1 * | 3/2010 | Takagi | ............ | 257/192 |
| 2010/0277233 A1 * | 11/2010 | Robinson et al. | ............ | 327/581 |

OTHER PUBLICATIONS

David Norwood, et al.; Diamond—A New High Thermal Conductivity Substrate for Multichip Modules and Hybrid Circuits; 1993; pp. 910-919; IEEE.

* cited by examiner

*Primary Examiner* — David Vu
*Assistant Examiner* — Earl Taylor
(74) *Attorney, Agent, or Firm* — Schwabe Williamson & Wyatt

(57) ABSTRACT

Embodiments of apparatuses, articles, methods, and systems for a monolithic microwave integrated circuit with a substrate having a diamond layer are generally described herein. Other embodiments may be described and claimed.

12 Claims, 9 Drawing Sheets

MONOLITHIC MICROWAVE INTEGRATED CIRCUIT WITH DIAMOND LAYER

FIELD

Embodiments of the present invention relate generally to the field of integrated circuits, and more particularly to a monolithic microwave integrated circuit with a diamond layer.

BACKGROUND

Monolithic microwave integrated circuits (MMICs) are integrated circuits designed to operate in millimeter-wave and microwave frequency ranges (e.g., 1 gigahertz (GHz) to 300 GHz). A gallium nitride (GaN)—based MMIC typically includes an active layer of aluminum gallium nitride/GaN (AlGaN/GaN) disposed on a suitable buffer layer. The buffer layer is, in turn, disposed on a silicon carbide (SiC) substrate. Active devices may be disposed on the AlGaN/GaN layer opposite the SiC substrate.

After MMIC fabrication is completed, the SiC substrate must be thick enough, e.g., greater than approximately 50-75 micrometers (μm), to prevent unacceptable transmission losses in transmission lines coupled to the active devices. At such a thickness, the flexibility of employing different types of materials for the substrate is limited.

BRIEF DESCRIPTION OF THE DRAWINGS

Embodiments of the invention are illustrated by way of example and not by way of limitation in the figures of the accompanying drawings, in which like references indicate similar elements and in which.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present invention; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

For the purposes of the present invention, the phrases "A/B" and "A and/or B" mean (A), (B), or (A and B). For the purposes of the present invention, the phrase "A, B, and/or C" means (A), (B), (C), (A and B), (A and C), (B and C), or (A, B, and C). For the purposes of the present invention, the phrase "(A)B" means (B) or (A and B), that is, A is an optional element.

Figure 1:
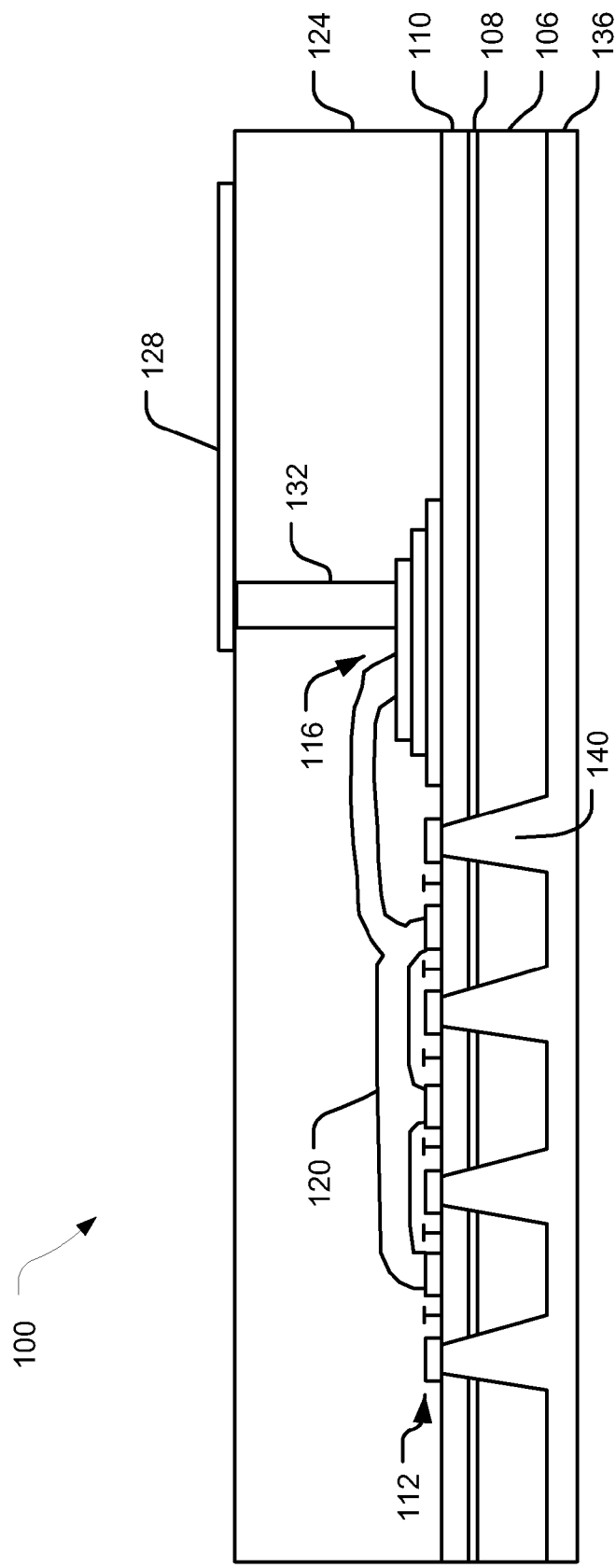
FIG. 1 is a cross-section view of a MMIC in accordance with various embodiments of the present invention.

FIG. 1 is a cross-section view of a MMIC 100 in accordance with various embodiments of the present invention. The MMIC 100 may have a substrate, which includes a diamond layer 106. The MMIC 100 may also have a buffer layer 108 coupled to an active layer 110 at a first side of the active layer 110. The buffer layer 108 may be a very thin layer, e.g., less than 2 μm, configured to facilitate the coupling of the active layer 110 to the diamond layer 106. In various embodiments, the buffer layer 108 may be constructed of one or more semiconductor materials, e.g., Si, gallium arsenide (GaAs), GaN, AlGaN, etc. The active layer 110 may also be constructed of one or more semiconductor materials, which may complement the materials used in the buffer layer 108. The semiconductor materials of the active layer 110 may include, but are not limited to, GaAs GaN, AlGaN, etc.

Active components 112 may be coupled to a second side of the active layer 110 and electrically coupled to a passive component, e.g., capacitor 116, through a conductive path such as a bridge 120. An active component, as used herein, may refer to a solid-state device that has gain, directionality, and/or control characteristics determined by reference to a particular embodiment. An active component may include, but is not limited to, a transistor, e.g., a field-effect transistor (FET), a bipolar junction transistor (BJT), a heterojunction bipolar transistor (HBT), etc. The active components may operate in any frequency range, including, but not limited to, millimeter-wave and microwave frequency ranges (e.g., 1 gigahertz (GHz) to 300 GHz).

The MMIC 100 may have a dielectric polymer layer 124 coupled to the second side of the active layer 110 in a manner to encompass the components disposed at the second side of the active layer 110. The dielectric polymer layer 124 may include a low dielectric constant (k) material such as, but not limited to, polyimide, benzocyclobutene (BCB), etc.

A transmission line 128 may be coupled to a top surface of the dielectric polymer layer 124 and electrically coupled to the capacitor 116 through a via 132 through the dielectric polymer layer 124. A ground layer 136, also referred to herein as a ground plane, corresponding to the transmission line 128, may be coupled to an opposite side of the MMIC 100. The ground layer 136 may be electrically coupled to the active components 112 by vias 140 through the diamond layer 106, the buffer layer 108, and the active layer 110.

The dielectric polymer layer 124 may have a sufficient thickness, e.g., approximately 10-100 μm, to provide low transmission losses through the transmission line 128. This may, in turn, allow for the thickness of the diamond layer 106 to be relatively thin, e.g., approximately 25 μm or less. Providing the diamond layer 106 with a thickness in this range may, among other things, enable the diamond layer 106 to function as a substrate with desired characteristics, e.g., heat transfer characteristics, appropriate rigidity, etc. A thick diamond layer, e.g., a thickness greater than 75 μm, may be prohibitively expensive and too rigid for some embodiments.

The active layer 110 may have a thickness of approximately 5 μm or less. Providing the active layer 110 with a thickness in this given range may, among other things, provide efficient transfer of thermal energy to a nearby heatsink, e.g., the diamond layer 106.

Figure 2:
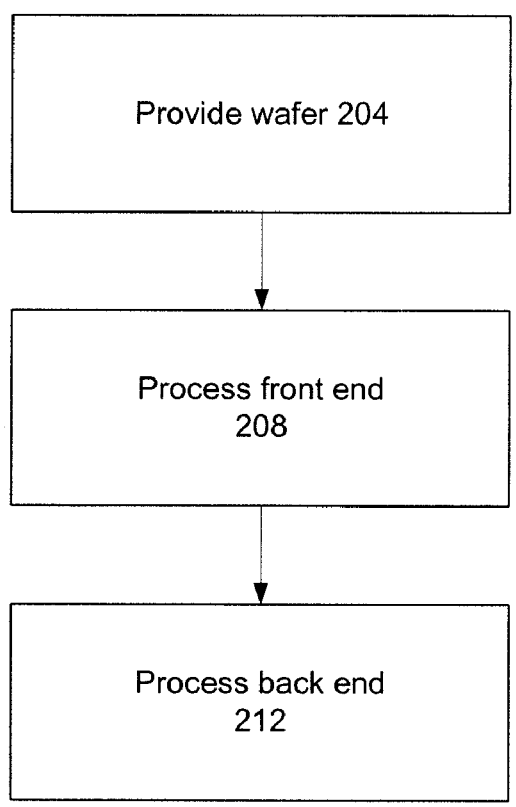
FIG. 2 is a flowchart illustrating operations involved in manufacturing a MMIC in accordance with various embodiments of the present invention.

FIG. 2 is a flowchart 200 illustrating operations involved in the manufacturing of a MMIC, such as MMIC 100, in accordance with various embodiments of the present invention.

Figure 3:
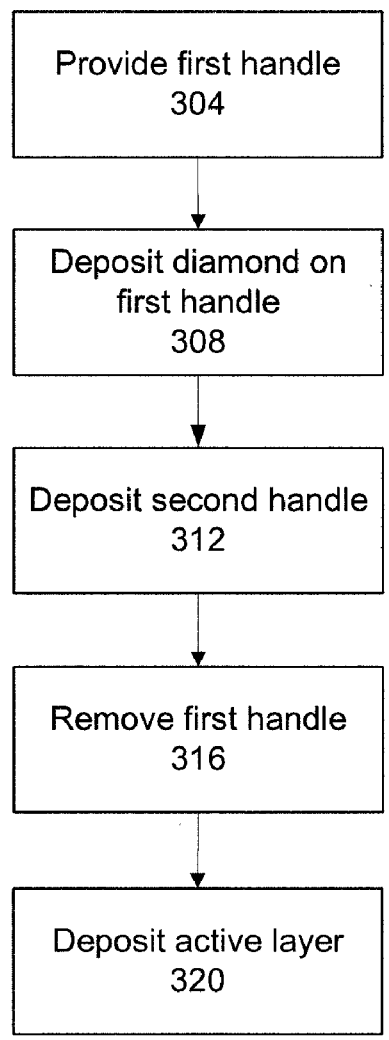
FIG. 3 is a flowchart illustrating process operations involved in the provisioning of a diamond and active layer wafer in accordance with various embodiments of the present invention.
Figure 4:
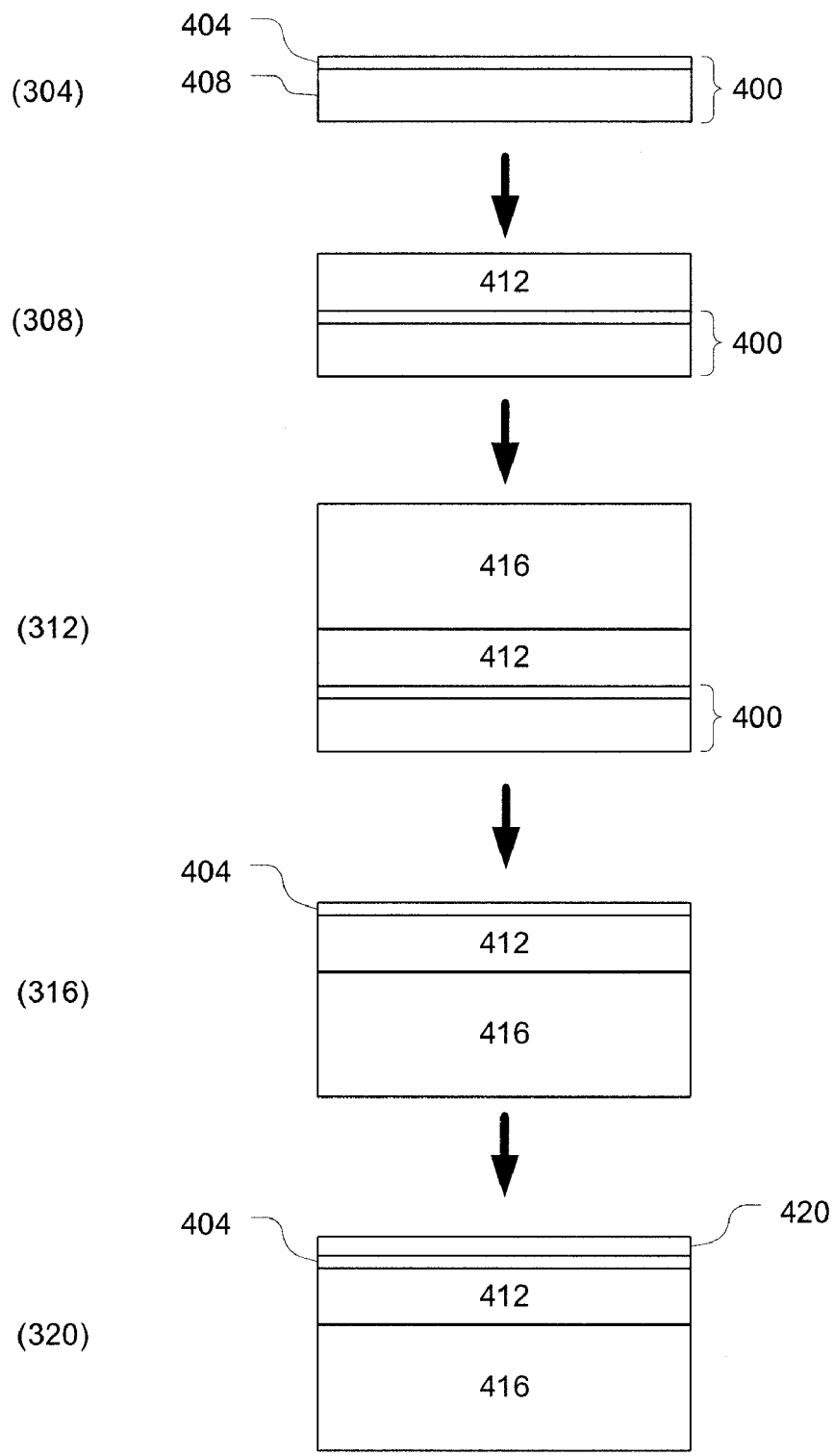
FIG. 4 is a cross-section view of an MMIC in various formative phases that correspond to the process operations discussed in FIG. 3 in accordance with various embodiments of the present invention.

At block 204 a wafer having a diamond layer, a buffer layer, and an active layer may be provided. FIG. 3 is a flowchart 300 depicting process operations involved in the provisioning of this wafer in accordance with some embodiments. FIG. 4 is a cross-section view of the MMIC in various formative phases that correspond to the process operations discussed in flowchart 300 in accordance with some embodiments.

Figure 5:
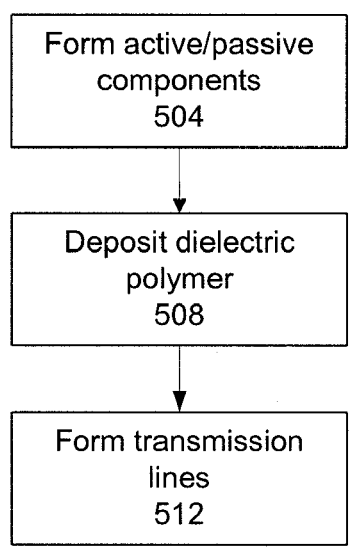
FIG. 5 is a flowchart illustrating process operations involved in front-end processing of the MMIC in accordance with various embodiments of the present invention.
Figure 6:
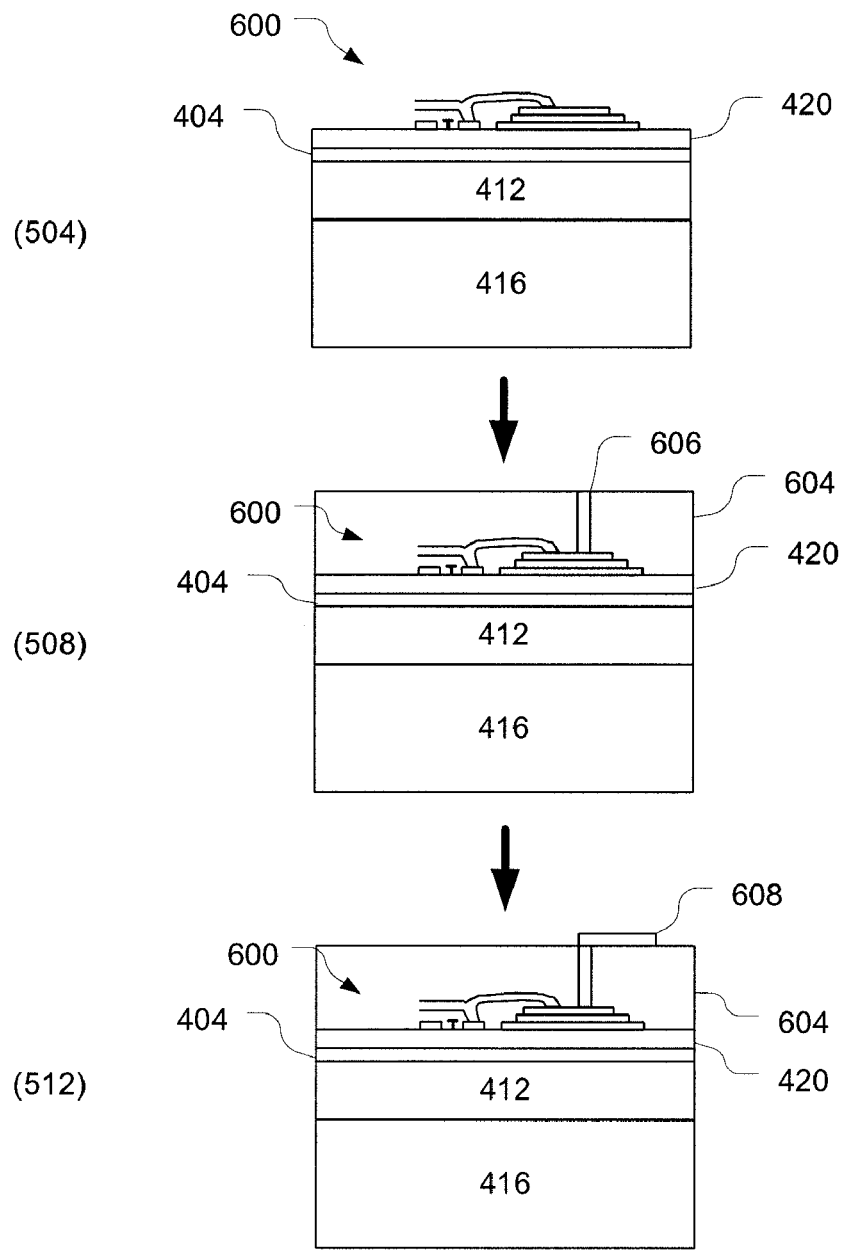
FIG. 6 is a cross-section view of the MMIC in various formative phases that correspond to the process operations discussed in FIG. 5 in accordance with various embodiments of the present invention.

At block 208, a front end of the MMIC may be processed. The front end, as used herein, may refer to the side of the MMIC having an active layer. FIG. 5 is a flowchart 500 depicting process operations involved in the front-end processing in accordance with some embodiments. FIG. 6 is a cross-section view of the MMIC in various formative phases that correspond to the process operations discussed in flowchart 500 in accordance with some embodiments.

Figure 7:
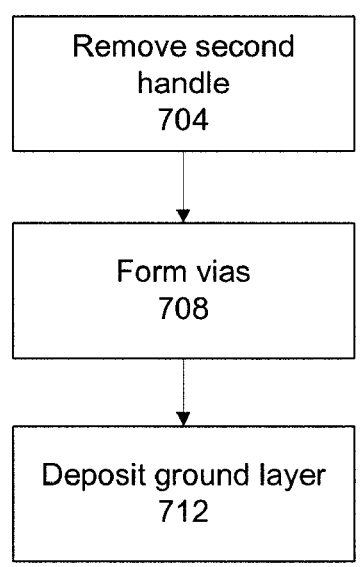
FIG. 7 is a flowchart illustrating process operations involved in back-end processing of the MMIC in accordance with various embodiments of the present invention.
Figure 8:
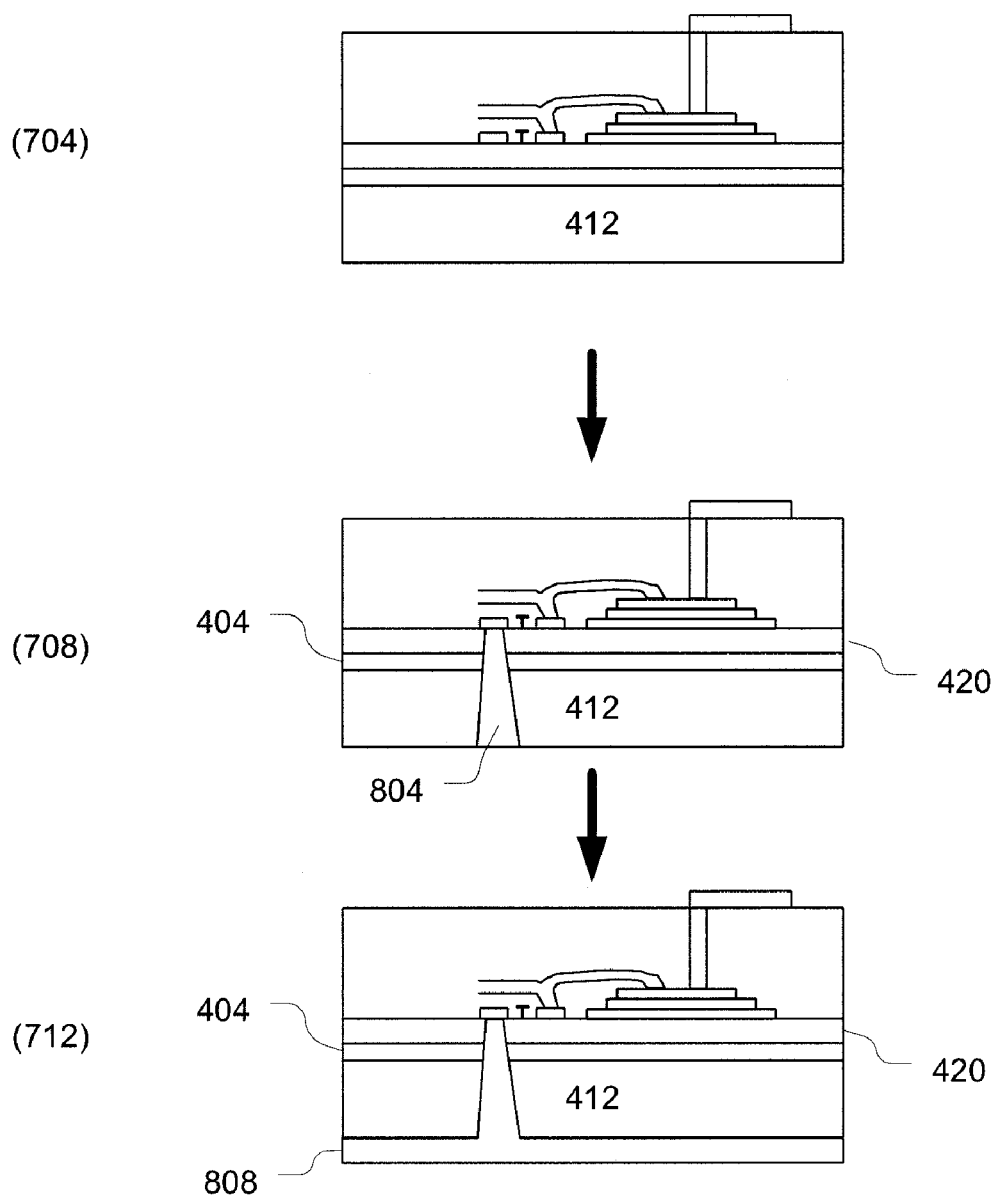
FIG. 8 is a cross-section view of the MMIC in various formative phases that correspond to the process operations discussed in FIG. 7 in accordance with various embodiments of the present invention.

At block 212, a back end of the MMIC may be processed. The back end, as used herein, may refer to the side of the MMIC opposite the front end. FIG. 7 is a flowchart 700 depicting process operations involved in the back-end processing in accordance with some embodiments. FIG. 8 is a cross-section view of the MMIC in various formative phases that correspond to the process operations discussed in flowchart 700 in accordance with some embodiments.

In various embodiments, the operations depicted by the flowchart 200 may be performed by different entities. For example, in one embodiment, a first entity may perform the operation at block 204, while another entity performs the operations at blocks 208 and 212. In other embodiments, one entity may perform all of the operations.

Reference numbers referring to process operations of FIGS. 3, 5, and 7 are shown in parentheses in FIGS. 4, 6, and 8, respectively.

Referring now to the provisioning of the wafer as detailed in FIGS. 3 and 4 in accordance with some embodiments, at block 304, a first handle 400 may be provided. The first handle 400 may include a buffer layer, e.g., Si layer 404, on a layer of silicon oxide (SiO) 408. At block 308, a diamond layer 412 may be deposited on the first handle 400. As used herein, deposited may include any process that grows, coats or otherwise transfers a material onto a surface.

In some embodiments, the diamond layer 412 may be deposited through the use of a chemical vapor deposition (CVD) technique. This may enable providing the diamond layer 412 with a thickness in the range approximately 25 μm or less as discussed above.

At block 312, a second handle 416 may be deposited on the diamond layer 412. The second handle 416 may be a layer of polycrystalline Si (poly Si) that is approximately 500 μm in some embodiments.

At block 316, at least a portion of the first handle 400 may be removed, e.g., through an etching process, and the MMIC may be flipped over. In this embodiment, only the SiO layer 408 is removed, while the Si layer 404 buffer is left.

At block 320, an active layer 420 may be deposited on the Si layer 404.

Front-end processing of the MMIC may be performed as detailed in FIGS. 5 and 6 in accordance with some embodiments. At block 504, active/passive components 600 may be formed at a first side of the active layer 420. Formation of the active/passive components 600 may include a variety of operations including, but not limited to: device isolation; metal plating/evaporation; nitride depositions for passivation; formation of ohmic contacts, gates, capacitors, routing lines; etc.

At block 508, a dielectric polymer 604 may be deposited to encompass the active/passive components 600 disposed at the first side of the active layer 420. In some embodiments, the dielectric polymer 604 may be deposited by spin-on and cure techniques.

A via 606 may be formed through the dielectric polymer 604 to provide a conductive path from various elements of the active/passive components 600, e.g., a capacitor, to the surface of the dielectric polymer 604. The via 606 may be formed after the dielectric polymer 604 has been deposited through etching and plating techniques; by plating a tall via first, spinning the dielectric polymer material on top, and then planarizing; or by some other technique.

At block 512, a transmission line 608 may be formed on top of the dielectric polymer 604 and electrically coupled to the active/passive components 600 through the via 606.

Back-end processing of the MMIC may be performed as detailed in FIGS. 7 and 8 in accordance with some embodiments. At block 704 at least a portion of the second handle 416 may be removed. In this embodiment, the entire second handle 416 may be removed. In some embodiments, the second handle 416 may be removed earlier in the sequence, e.g., at the provisioning of the wafer at block 204.

At block 708, a via 804 may be formed through the diamond layer 412, Si layer 404, and active layer 420 to provide a conductive path to various elements of the active/passive components 600, e.g., to sources of active devices. In various embodiments, sections of the via 804 may be formed in iterative stages intermixed with the layer depositioning operations. The via 804 may be plated after formation.

At block 712, a ground layer 808 may be deposited on the diamond layer 412 as shown.

In various embodiments, MMICs having a thin diamond layer as taught herein (e.g., MMIC 100) may be formed through process operations that vary from those depicted in FIGS. 3-8.

Figure 9:
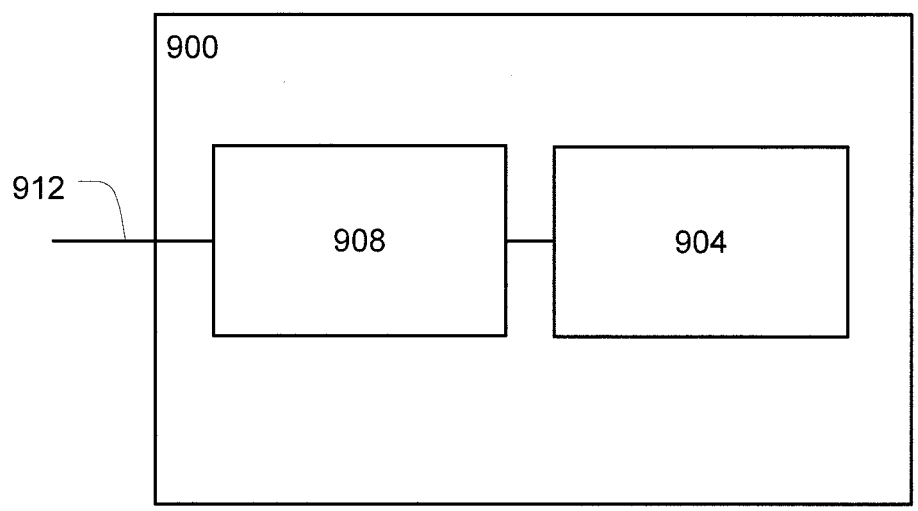
FIG. 9 is a signaling system in accordance with various embodiments of the present invention.

FIG. 9 illustrates a signaling system 900 in accordance with various embodiments of the present invention. The system 900 may include a controller 904 coupled to a MMIC 908. The MMIC 908, which may be substantially interchangeable with any of the MMICs described in other embodiments of the present invention, may include circuit components configured to perform a variety of transmit/receive functions for the signaling system 900. These functions include, but are not limited to, microwave mixing, power amplification, low-noise amplification, high-frequency switching, etc.

The controller 904, which may be a digital controller in some embodiments, may control the MMIC 908 to transmit/receive signals via a signaling medium 912. The signaling medium 912 may be a wireless medium, a wired medium, or a wire-like medium (e.g., optical fiber).

The signaling system 900 may be a device capable of transmitting/receiving signals in a variety of military/civilian applications. For example, the signaling system 900 may be a radar, a wireless communication device (e.g., a mobile device such as a mobile phone or a wireless network infrastructure device such as a base station); a wired/wire-like communication device, etc.

Although the present invention has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present invention. Those with skill in the art will readily appreciate that the present invention may be implemented in a very wide variety of embodiments. This description is intended to be regarded as illustrative instead of restrictive on embodiments of the present invention.

What is claimed is:

1. A monolithic microwave integrated circuit (MMIC) comprising:
   a substrate including a diamond layer having a thickness of approximately 25 micrometers or less;
   an active layer coupled to the substrate, the active layer having a first side adjacent to the substrate and a second side;
   a plurality of transistors disposed at the second side of the active layer;
   a dielectric polymer layer coupled to the second side of the active layer and encompassing the plurality of transistors;
   a transmission line coupled to a top surface of the dielectric polymer layer and electrically coupled to a first transistor of the plurality of transistors by a via through the dielectric polymer layer; and
   a ground plane corresponding to the transmission line and electrically coupled to the plurality of transistors by one or more vias through the substrate and the active layer.

2. The MMIC of claim 1, wherein the dielectric polymer layer comprises polyimide and/or benzocyclobutene.

3. The MMIC of claim 1, further comprising:
   a capacitor coupled to the second side of the active layer and configured to electrically couple the first transistor to the via.

4. The MMIC of claim 1, wherein the dielectric polymer layer has a thickness between approximately 10-100 micrometers.

5. The MMIC of claim 1, wherein the active layer has a thickness of approximately 5 micrometers or less.

6. The MMIC of claim 1, wherein the plurality of transistors are configured to operate in a microwave and/or millimeter wave frequency range.

7. A system comprising:
   a monolithic microwave integrated circuit (MMIC) including
      a substrate having a diamond layer that has a thickness of approximately 25 micrometers or less;
      an active layer, coupled to the substrate, having a first side adjacent to the substrate and a second side;
      a plurality of transistors disposed at the second side of the active layer;
      a dielectric polymer layer coupled to the second side of the active layer and encompassing the plurality of transistors;
      a transmission line coupled to a top surface of the dielectric polymer layer and electrically coupled to a first transistor of the plurality of transistors by a via through the dielectric polymer layer; and
      a ground plane corresponding to the transmission line and electrically coupled to the plurality of transistors by one or more vias through the substrate and the active layer; and
   a controller configured to control the MMIC in a manner to transmit and/or receive signals via a signaling medium.

8. The system of claim 7, wherein the dielectric polymer has a thickness between approximately 10-100 micrometers.

9. The system of claim 7, wherein the dielectric polymer layer comprises polyimide and/or benzocyclobutene.

10. The system of claim 7, wherein the active layer has a thickness of approximately 5 micrometers or less.

11. The MMIC of claim 7, wherein the diamond layer has a thickness of approximately 25 micrometers.

12. The MMIC of claim 1, wherein the diamond layer has a thickness of approximately 25 micrometers.

* * * * *

UNITED STATES PATENT AND TRADEMARK OFFICE
CERTIFICATE OF CORRECTION

| | | |
|---|---|---|
| PATENT NO. | : 8,143,654 B1 | Page 1 of 1 |
| APPLICATION NO. | : 12/015415 | |
| DATED | : March 27, 2012 | |
| INVENTOR(S) | : Saunier | |

It is certified that error appears in the above-identified patent and that said Letters Patent is hereby corrected as shown below:

In the Claims

Column 6, Line 44, Claim 11 should be corrected from "The MMIC of claim 7" to --The system of claim 7--.

Signed and Sealed this
Twenty-fifth Day of February, 2014

Michelle K. Lee
*Deputy Director of the United States Patent and Trademark Office*